(12) United States Patent
Huo et al.

(10) Patent No.: US 11,218,824 B1
(45) Date of Patent: Jan. 4, 2022

(54) COOLING AND NOISE CONTROL FOR HEAD-MOUNTED DEVICE

(71) Applicant: Apple Inc., Cupertino, CA (US)

(72) Inventors: Edward S. Huo, Sunnyvale, CA (US); Trevor J. Ness, Santa Cruz, CA (US); Sivesh Selvakumar, Sunnyvale, CA (US); Anna V. Mirabella, Palo Alto, CA (US); Phil M. Hobson, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 20 days.

(21) Appl. No.: 16/752,508

(22) Filed: Jan. 24, 2020

Related U.S. Application Data (60) Provisional application No. 62/804,667, filed on Feb. 12, 2019.

(51) Int. Cl.
| | |
|---|---|
| *H04R 29/00* | (2006.01) |
| *H04R 1/08* | (2006.01) |
| *H04R 1/10* | (2006.01) |
| *G10L 25/21* | (2013.01) |
| *G06F 3/16* | (2006.01) |
| *H05K 7/20* | (2006.01) |
| *G10L 25/51* | (2013.01) |

(52) U.S. Cl.
CPC ........... *H04R 29/001* (2013.01); *G06F 3/165* (2013.01); *G10L 25/51* (2013.01); *H04R 1/08* (2013.01); *H04R 1/1008* (2013.01); *H04R 1/1075* (2013.01); *H05K 7/20145* (2013.01); *H05K 7/20172* (2013.01); *H05K 7/20209* (2013.01)

(58) Field of Classification Search
CPC ......... H04R 29/001; H04R 1/08; G06F 3/165; G10L 25/51; H05K 7/20172; H05K 7/20209; H05K 7/20145
USPC .......................................................... 381/56
See application file for complete search history.

(56) References Cited

U.S. PATENT DOCUMENTS

| | | | |
|---|---|---|---|
| 6,494,381 B2 * | 12/2002 | Bulthuis | G06F 1/206 |
| | | | 181/141 |
| 7,941,231 B1 | 5/2011 | Dunn | |
| 8,786,675 B2 | 7/2014 | Deering | |
| 2009/0002939 A1 | 1/2009 | Baugh et al. | |

(Continued)

FOREIGN PATENT DOCUMENTS

WO     WO 2018/188079     10/2018

*Primary Examiner* — Vivian C Chin
*Assistant Examiner* — Douglas J Suthers
(74) *Attorney, Agent, or Firm* — Morgan, Lewis & Bockius LLP (57) ABSTRACT

A head-mounted device can effectively manage heat while also managing noise output levels in a manner that preserves the user's desired experience with the head-mounted device. The head-mounted device can manage sound levels of a cooling system based on detected a sound level of ambient noise in a vicinity of the head-mounted device. For example, the head-mounted device can operate a fan at a speed that produces noise at a sound level that is low enough to be masked by the ambient noise perceived by the user. By further example, the sound level of a cooling system can be based on a sound level of a speaker of the head-mounted device providing audio to the user. By further example, other operational parameters of a cooling system can be controlled to manage noise at a sound level that is sufficiently low.

17 Claims, 2 Drawing Sheets

(56) References Cited

U.S. PATENT DOCUMENTS

2009/0180637 A1\* 7/2009 Su ................... G10K 11/17855
  381/71.12
2010/0079356 A1\* 4/2010 Hoellwarth ............. G06F 3/041
  345/8
2017/0184863 A1\* 6/2017 Balachandreswaran .....................
  G02B 27/0176

\* cited by examiner

COOLING AND NOISE CONTROL FOR HEAD-MOUNTED DEVICE

CROSS-REFERENCE TO RELATED APPLICATION

This application claims the benefit of U.S. Provisional Application No. 62/804,667, entitled "COOLING AND NOISE CONTROL FOR HEAD-MOUNTED DEVICE," filed Feb. 12, 2019, the entirety of which is incorporated herein by reference.

TECHNICAL FIELD

The present description relates generally to head-mounted devices, and, more particularly, to cooling and noise control for head-mounted devices.

BACKGROUND

A head-mounted device can be worn by a user to display visual information within the field of view of the user. The head-mounted device can be used as a virtual reality (VR) system, an augmented reality (AR) system, and/or a mixed reality (MR) system. A user may observe outputs provided by the head-mounted device, such as visual information provided on a display. The display can optionally allow a user to observe an environment outside of the head-mounted device. Other outputs provided by the head-mounted device can include speaker output and/or haptic feedback. A user may further interact with the head-mounted device by providing inputs for processing by one or more components of the head-mounted device. For example, the user can provide tactile inputs, voice commands, and other inputs while the device is mounted to the user's head.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Head-mounted devices, such as head-mounted displays, headsets, visors, smartglasses, head-up display, etc., can perform a range of functions that are managed by the components (e.g., sensors, circuitry, and other hardware) included with the wearable device. The head-mounted device can provide a user experience that is immersive or otherwise natural so the user can easily focus on enjoying the experience without being distracted by the mechanisms of the head-mounted device.

Components of a head-mounted device can generate heat during operation. Excessive heat for long durations of time can damage the components of the head-mounted device and cause discomfort to the user. Heat can be mitigated in a number of ways, including with mechanisms that are integrated into the head-mounted device. However, operation of cooling mechanisms can generate noise that may interfere with the user's desired experience with the head-mounted device.

Systems of the present disclosure can provide a head-mounted device that effectively manages heat while also managing noise output levels in a manner that preserves the user's desired experience with the head-mounted device. The head-mounted device can manage sound levels of a cooling system based on detected a sound level of ambient noise in a vicinity of the head-mounted device. For example, the head-mounted device can operate a fan at a speed that produces noise at a sound level that is low enough to be masked by the ambient noise perceived by the user. By further example, the sound level of a cooling system can be based on a sound level of a speaker of the head-mounted device providing audio to the user. By further example, other operational parameters of a cooling system can be controlled to manage noise at a sound level that is sufficiently low. These measure provide effective cooling to the head-mounted device while maintaining the user's desired experience with the head-mounted device.

These and other embodiments are discussed below with reference to FIGS. 1-4. However, those skilled in the art will readily appreciate that the detailed description given herein with respect to these Figures is for explanatory purposes only and should not be construed as limiting.

Figure 1:
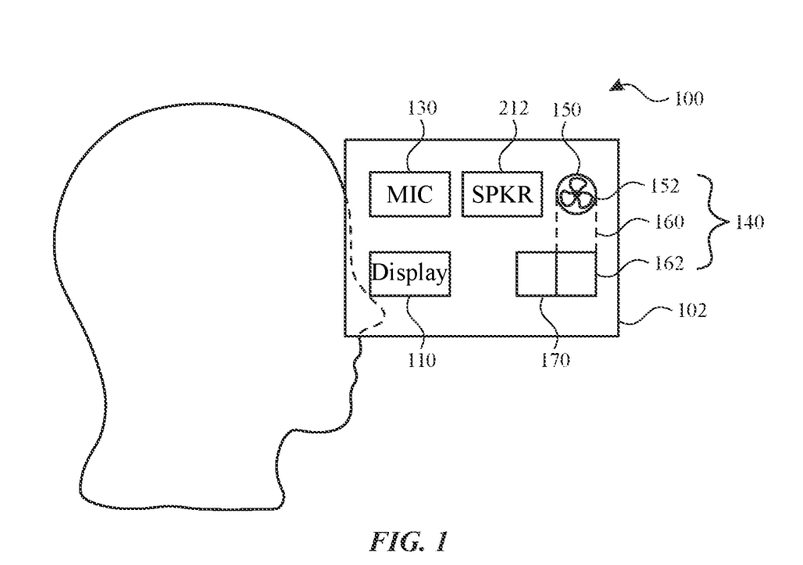
FIG. 1 illustrates a perspective view of a head-mounted device, according to some embodiments of the present disclosure.

According to some embodiments, for example as shown in FIG. 1, a head-mounted device 100 includes a frame 102 that is worn on a head of a user with a securement element to secure the frame 102 to the head of the user. The frame 102 can be positioned in front of the eyes of a user to provide information within a field of view of the user. The frame 102 can provide nose pads or another feature to rest on a user's nose. The frame 102 further includes one or more display elements 110.

The frame 102 can provide structure around a peripheral region thereof to support any internal components of the frame 102 in their assembled position. For example, the frame 102 can enclose and support various internal components (including for example integrated circuit chips, processors, memory devices and other circuitry) to provide computing and functional operations for the head-mounted device 100, as discussed further herein. For example, a controller 170 is shown within the frame 102. However, any number of components can be included within the frame 102 and/or the securement element.

A display element 110 can transmit light from a physical environment for viewing by the user. Such a display element 110 can include optical properties, such lenses for vision correction based on incoming light from the physical environment. Additionally or alternatively, a display element 110 can provide information as a display within a field of view of the user. Such information can be provided to the exclusion of a view of a physical environment or in addition to (e.g., overlaid with) a physical environment.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations, (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Examples of mixed realities include augmented reality and augmented virtuality.

An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head-mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head-mounted system may have one or more speaker(s) and an integrated opaque display. Alternatively, a head-mounted system may be configured to accept an external opaque display (e.g., a smartphone). The head-mounted system may incorporate one or more imaging sensors to capture images or video of the physical environment, and/or one or more microphones to capture audio of the physical environment. Rather than an opaque display, a head-mounted system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

The head-mounted device 100 can include a cooling system 140 that provides cooling to one or more components of the head-mounted device 100. The cooling system 140 can include components that are operable during use of the head-mounted device 100. For example, the cooling system 140 can include a fan 150 for directing air or another fluid within, against, or across one or more components of the head-mounted device 100. As shown in FIG. 1, the fan 150 can include multiple blades 152 that can move to urge air in a desired direction. The blades can be provided at an angle (e.g., angle of attack) relative to an axis of rotation to urge the air as they rotate about the axis. As used herein, a fan can include any mechanism that provides mechanical movement of a fluid (e.g., gas or liquid). Examples include pumps, turbines, compressors, blowers, and piezo air movers. The examples provided herein are illustrative, rather than limiting.

The fan 150 can be operated based on one or more operating parameters that are controllable during use. The operating parameters can be determined, at least in part, based on a demand for cooling (e.g., based on a temperature of one or more components, such as the controller 170). The operating parameters can be further determined based on acceptable sound levels to be produced by the fan 150, as discussed further herein.

As used herein, a sound level is a measurement of sound (e.g., acoustic) energy in air. Sound levels can be perceptible by a user's ears and sounds can have relatively high (e.g., loud) or low (e.g., quiet) levels. Absolute and relative sound levels can be measured in accordance with a sound pressure level meter at a given location. As such, any location in space can be used as a reference to determine sound levels measurable at such a location. A sound level can be determined as a level perceptible by a user operating the head-mounted device. Accordingly, a reference location for determining a sound level can be at an ear of a user wearing a head-mounted device.

For example, a rotational speed of the fan 150 can be controlled to provide effective cooling at an acceptable sound level. Other operating parameters are also contemplated, such as a shape of the fan. For example, blades 152 of the fan can be altered (e.g., with an angle of attack) to provide different flow rates and sound levels. Where multiple fans are provided, the number of fans can be controlled to manage the amount of cooling provided and the amount of noise produced. Additionally or alternatively, each of multiple fans can be controlled independently to produce noise at different sound levels, different frequencies, or other parameters.

The cooling system 140 can further include a flow path 160. The flow path 160 can extend across, near, or adjacent to a component (e.g., controller 170) to be cooled. It will be appreciated that the component to be cooled can be any component of the head-mounted device 100 and/or another device in the vicinity of the head-mounted device 100. For example, the component to be cooled can be an electronic component, a controller, a processor, a battery, a sensor, an antenna, or any component in thermal connection with another component to be cooled through heat dissipation. The flow path 160 can include an inlet and an outlet and extend between the fan 150 and the component to be cooled.

The flow path 160 can connect the fan 150 directly to the component to be cooled. For example, the flow path 160 can expose at least a portion of the component so that a flow provides cooling directly to the component. Additionally or alternatively, the flow path 160 can be defined by one or more structures that are thermally connected to the component to be cooled. For example, a heat sink 162 can be provided as thermally connected to the component and exposed to the flow path 160.

The flow path 160 and/or the heat sink 162 can be operated based on the one or more operating parameters that are controllable during use. The operating parameters can be determined based on acceptable sound levels to be produced by the flow path 160 and/or the heat sink 162. The shape and/or position of the flow path 160 and/or the heat sink 162 can be modified to provide different flows (e.g., laminar or turbulent). For example, the flow path 160 can be modified by mechanical actuation to be more or less tortuous. By further example, the heat sink 162 can be moved or altered (e.g., by moving fins or other components thereof) to produce a different flow there through.

Such differences can contribute to both the amount of cooling provided and the amount of noise produced. For example, a more turbulent flow can disrupt boundary layers along structures and provide more efficient cooling. More turbulent flow can also produce noise at higher sound levels. Furthermore, less turbulent flow can produce noise at lower sound levels with less efficient cooling.

While the controller 170 and the cooling system 140 (e.g., fan 150 and flow path 160) are shown within the frame 102, it will be understood that some or all of these components can be located anywhere within or on the head-mounted device 100. For example, one or more of these components can be positioned within one or more of the securement element 120 of the head-mounted device 100. Where components are positioned across the frame 102 and the securement element 120, flow can be directed between the frame 102 and the securement element 120.

As further shown in FIG. 1, the head-mounted device 100 can include one or more microphones 130. A microphone 130 can be operated to detect a sound level of a noise. For example, the microphone 130 can be operated to detect a sound level of an ambient noise in a vicinity of the head-mounted device 100. Such a detection can be used to determine an acceptable sound level of the fan 150 during operation, as discussed further herein.

The microphone 130 can be positioned on a side of the head-mounted device 100 that is opposite the fan 150 to detect the ambient noise with reduced contribution of the fan noise. For example, as shown in FIG. 1, the microphone 130 can be on a first side of the frame 102 that is opposite the fan 150 on a second side of the frame 102. By further example, the microphone 130 can be positioned on one portion of the securement element 120, and the fan 150 can be positioned on another portion of the securement element 120. Additionally or alternatively, multiple microphones 130 can be provided at different distances from the fan 150 to isolate ambient noise from fan noise. The provision of multiple fans is optional, as sound level of noise produced by the fan 150 can be known based on known operational parameters (e.g., speed) of the fan 150.

As further shown in FIG. 1, the head-mounted device 100 can include one or more speakers 212. A speaker 212 can be operated to produce sound for the user. For example, the speaker 212 can be positioned on the securement element 120 to be near the ears of the user when the head-mounted device 100 is worn by the user. The speakers 212 can optionally be part of a component that extends from the securement element 120 toward the ears, for example to reside on or within the ears of the user (e.g., as headphones or earphones). The speakers 212 can optionally utilize beamforming techniques to direct sound to the ears of the user.

The speakers 212 can be operated at a sound level that can be directly controlled by the head-mounted device 100. The operating sound level of the speakers 212 can be used to determine an acceptable sound level of the fan 150 during operation, as discussed further herein.

Figure 2:
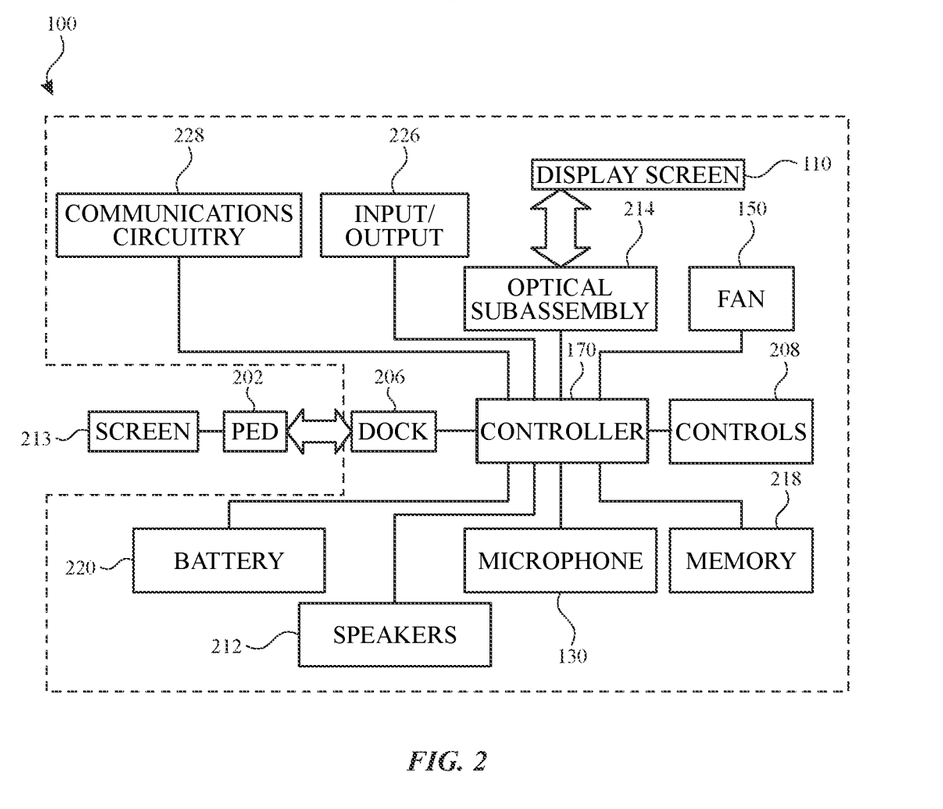
FIG. 2 illustrates a block diagram of a head-mounted device, in accordance with some embodiments of the present disclosure.

Components of the head-mounted device can be operably connected to provide the performance described herein. FIG. 2 shows a simplified block diagram of an illustrative head-mounted device 100 in accordance with one embodiment of the invention. It will be appreciated that components described herein can be provided on either or both of a frame and/or a securement element of the head-mounted device 100.

As shown in FIG. 2, the head-mounted device 100 can include a controller 170 with one or more processing units that include or are configured to access a memory 218 having instructions stored thereon. The instructions or computer programs may be configured to perform one or more of the operations or functions described with respect to the head-mounted device 100. The controller 170 can be implemented as any electronic device capable of processing, receiving, or transmitting data or instructions. For example, the controller 170 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 218 can store electronic data that can be used by the head-mounted device 100. For example, the memory 218 can store electrical data or content such as, for example, audio and video files, documents and applications, device settings and user preferences, timing and control signals or data for the various modules, data structures or databases, and so on. The memory 218 can be configured as any type of memory. By way of example only, the memory 218 can be implemented as random access memory, read-only memory, Flash memory, removable memory, or other types of storage elements, or combinations of such devices.

The head-mounted device 100 can further include a display element 110 for displaying visual information for a user. The display element 110 can provide visual (e.g., image or video) output. The display element 110 can be or include an opaque, transparent, and/or translucent display. The display element 110 may have a transparent or translucent medium through which light representative of images is directed to a user's eyes. The display element 110 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mounted device 100 can include an optical subassembly 214 configured to help optically adjust and correctly project the image based content being displayed by the display element 110 for close up viewing. The optical subassembly 214 can include one or more lenses, mirrors, or other optical devices.

In some embodiments, controller 170 can receive user inputs from controls 208 and execute operations in response to the inputs. For example, controller 170 can be configured to receive sound from the microphone 130. In response to receiving the sound, controller 170 can run the voice recognition module to identify voice commands.

Head-mounted device 100 can include a battery 220, which can charge and/or power components of the head-mounted device 100. The battery 220 can also charge and/or power components connected to the head-mounted device 100, such as a portable electronic device 202, as discussed further herein.

Head-mounted device 100 can include the fan 150 and/or any other suitable component for cooling down components of the head-mounted device 100. Suitable components can include, for example, fans, pipes for transferring heat, vents, apertures, holes, any other component suitable for distributing and diffusing heat, or any combination thereof. The fan 150 may also or instead be manufactured from materials selected for heat dissipation properties. For example, a housing of the head-mounted device 100 may be configured to distribute heat away from components thereof and/or the user.

The head-mounted device 100 can include an input/output component 226, which can include any suitable component for connecting head-mounted device 100 to other devices. Suitable components can include, for example, audio/video jacks, data connectors, or any additional or alternative input/output components.

The head-mounted device 100 can include communications circuitry 228 for communicating with one or more servers or other devices using any suitable communications protocol. For example, communications circuitry 228 can support Wi-Fi (e.g., a 802.11 protocol), Ethernet, Bluetooth, high frequency systems (e.g., 900 MHz, 2.4 GHz, and 5.6

GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 228 can also include an antenna for transmitting and receiving electromagnetic signals.

The head-mounted device 100 can include the microphone 130 as described herein. The microphone 130 can be operably connected to the controller 170 for detection of sound levels and communication of detections for further processing, as described further herein.

The head-mounted device 100 can include the speakers 212 as described herein. The speakers 212 can be operably connected to the controller 170 for control of speaker output, including sound levels, as described further herein.

The head-mounted device 100 can optionally connect to a portable electronic device 202, which can provide certain functions. For the sake of brevity, the portable electronic device 202 will not be described in detail in FIG. 2. It should be appreciated, however, that the portable electronic device 202 may be embodied in a variety of forms including a variety of features, all or some of which can be utilized by the head-mounted device 100 (e.g., input/output, controls, processing, battery, etc.). The portable electronic device 202 can receiving cooling from operation of the fan 150. The portable electronic device 202 can provide a handheld form factor (e.g., small portable electronic device which is light weight, fits in a pocket, etc.). Although not limited to these, examples include media players, phones (including smart phones), PDAs, computers, and the like. The portable electronic device 202 may include a screen 213 for presenting the graphical portion of the media to the user. The screen 213 can be utilized as the primary screen of the head-mounted device 100.

The head-mounted device 100 can include a dock 206 operative to receive the portable electronic device 202. The dock 206 can include a connector (e.g., Lightning, USB, FireWire, power, DVI, etc.), which can be plugged into a complementary connector of the portable electronic device 202. The dock 206 may include features for helping to align the connectors during engagement and for physically coupling the portable electronic device 202 to the head-mounted device 100. For example, the dock 206 may define a cavity for placement of the portable electronic device 202. The dock 206 may also include retaining features for securing portable electronic device 202 within the cavity. The connector on the dock 206 can function as a communication interface between the portable electronic device 202 and the head-mounted device 100.

The head-mounted device 100 can include one or more other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

Figure 3:
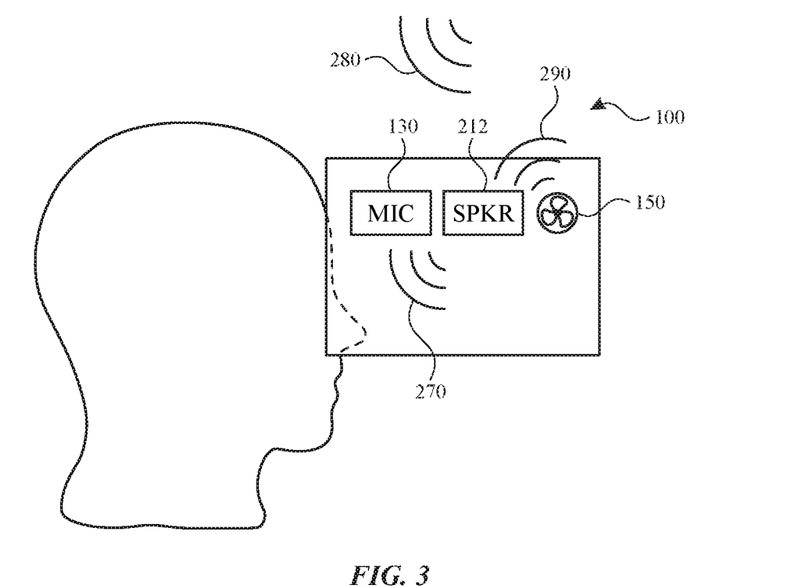
FIG. 3 illustrates another perspective view of the head-mounted device of FIG. 1, according to some embodiments of the present disclosure.

Referring now to FIG. 3, the head-mounted device 100 can control operation of a fan based on one or more detections or determinations made during use. As shown, operation of the fan 150 can emit fan noise 290 that can interfere with a user's experience of the head-mounted device 100. However, the fan 150 can be operated in a manner that is conducive to the user's desired experience.

As further shown in FIG. 3, the user may perceive other noises, such as ambient noise 280 and or speaker output 270 from one or more speakers 212. Where other noises perceived by the user are sufficiently loud, the fan noise 290 produced by the fan 150 may be sufficiently quiet so as to be effectively imperceptible to the user. Accordingly, the fan 150 can be operated to produce sufficiently low sound levels.

For example, the sound level of the ambient noise 280 can be determined based at least in part on detections by the microphone 130. The ambient noise can be from a user's environment, other people, a device operated in conjunction with the head-mounted device (e.g., an external speaker), and/or another device. The ambient noise 280 can represent a sound level that is acceptable to the user. Therefore, it can be advantageous to maintain the fan noise 290 at a sound level that is below the sound level of the ambient noise 280.

By further example, the sound level of the speaker output 270 can be known based on the operations of the speaker 212. For example, the sound level of the speaker output 270 can be directly controlled by the user and the head-mounted device 100. Additionally or alternatively, the speaker output 270 can be determined by other detection techniques. The determination of speaker output 270 can represent a sound level that is acceptable to the user. Therefore, it can be advantageous to maintain the fan noise 290 at a sound level that is below the sound level of the speaker output 270.

Additionally or alternatively, other measures can be implemented to manage cooling and sound levels. For example, user perception of a known or detectable fan noise 290 can be masked by operating the speakers 212 to produce speaker output 270 at a frequency that matches a frequency of the fan noise 290. Destructive interference between the speaker output 270 and the fan noise 290 can reduce or eliminate user perception of the fan noise 290.

Additionally or alternatively, the head-mounted device 100 can manage sound by reducing a demand for cooling. For example, where a demand for cooling exceeds a fan's ability to cool while remaining below an acceptable sound level threshold, the head-mounted device 100 can reduce a demand for cooling by reducing a heat-generating activity of the given component. This allows the component to cool sufficiently under the influence of the acceptable fan operation.

Figure 4:
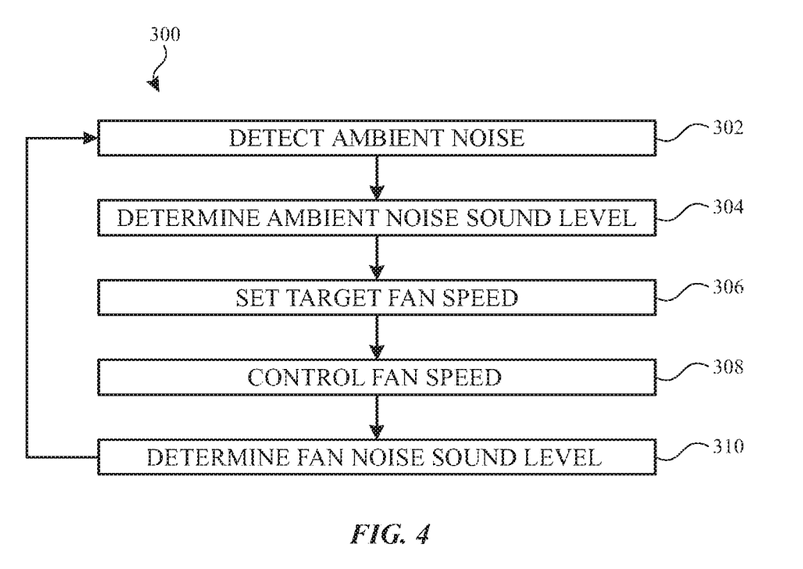
FIG. 4 illustrates a flow chart, in accordance with some embodiments of the present disclosure.

Referring now to FIG. 4, a flow chart is provided illustrating a method 300 for managing sound levels. It will be understood that the method 300 illustrated in FIG. 4 is merely an example, and that a method can be performed with additional steps and/or fewer steps than those illustrated in FIG. 4.

In operation 302, a sound level of an ambient noise can be detected. The detected noise can include ambient noise as well as other noises, such as fan noise and/or speaker output noise. The noise can be detected by one or more microphones of the head-mounted device. Optionally, multiple microphones can provide separate measurements for later processing.

In operation 304, an ambient noise sound level is determined based, at least in part, on the detection from operation 302. For example, the total sound level detected by a microphone can be analyzed to determine the contribution from a fan and a contribution from other sources. Where the fan noise sound level is known or determined, its contribution to total noise can be isolated to determine ambient noise sound level. The remaining ambient noise sound level can represent an acceptable sound level for a user.

In operation 306, a target fan speed is set. The fan speed can be based at least in part on a demand for cooling (e.g., based on component temperature measurements). Where temperatures are high, faster fan speeds can be desired for more rapid cooling. The fan speed can be further based on speeds that are known to produce fan noise sound levels that are below a threshold. For example, a lookup table can be provided with speeds and their corresponding sound levels. A sound level that is within an acceptable sound level of a user can be applied. For example, a speed can be selected to produce a fan noise sound level that is below the ambient noise sound level. In some examples, a maximum fan speed is determined based on the determination of the ambient noise sound level, and a minimum fan speed is determined based on the demand for cooling (e.g., based on component temperature measurements).

In operation 308, the fan speed is controlled according to target fan speeds set in operation 306. Fan speeds within a range can be considered candidates for applying to the fan. If the minimum and maximum do not provide any acceptable fan speeds, then the head-mounted device can optionally reduce a heat-generating activity of the component to be cooled.

In operation 310, the known fan speed will produce a fan noise with a known of detectable sound level. Accordingly, the contribution of the new fan noise to total noise can be applied to later detections and determinations. As such, the method 300 can optionally begin again at operation 302. Additionally or alternatively, the method can optionally begin again at operation 304 by applying the previously detected ambient noise.

As such, the method 300 can by implemented to manage the fan speed within acceptable operational parameters. While method 300 refers to fan speed, it will be appreciated that other operational parameters of the head-mounted device can be managed in a similar manner. For example, the shape and/or position of a fan, a flow path, and/or a heat sink can be modified to alter cooling and noise production.

Additionally or alternatively, the frequency of the fan noise can be controlled to provide effective cooling and reduce perceived noise. For example, the fan can be operated to produce a noise at a frequency that is outside the user's perception and/or subject to noise cancellation from the speakers.

Additionally or alternatively, the speaker output of the speakers can be controlled to provide effective masking of fan noise. For example, the volume of speakers (e.g., within a range) can be altered to be greater than fan noise.

Additionally or alternatively, a type of speaker and/or an operating parameter of a speaker can be detected or controlled to manage sound levels. For example, speakers can be in-ear speakers, over-ear speakers, noise-cancelling speakers, and/or open back speakers. The type of speakers can affect how noise is perceived by the user and how other noises (e.g., fan noise and/or ambient noise) are perceived by the user. It can be determined whether the speaker is one of multiple types of speakers, each of the multiple types of speakers being configured to engage an ear of the user in a different way. For example, an in-ear speaker can provide speaker noise directly to the user while physically blocking noises from an external environment. By further example, operational parameters, such as noise-cancelation functions, can be detected and/or controlled to sonically block the user's perception of noises from an external environment. Such considerations can be included when managing fan operations.

Additionally or alternatively, the cooling system (e.g., fan) can be operated to produce noise at or below a target sound level based on a detection that another person is in a vicinity of the head-mounted device. For example, the head-mounted device can detect another person by proximity sensors, heat sensors, speech recognition, or another method. While in the presence of another person and/or when speech is detected, the cooling system can be operated at a lower sound level so as not to disturb others or interfere with speech. For example, such detections can contribute to a determination of a maximum sound level to be applied.

Additionally or alternatively, the cooling system (e.g., fan) can be operated to produce noise at or below a target sound level based on a determination that a quiet environment is desired for operations of the head-mounted device. For example, where the head-mounted device or another device is known to be operating a speech recognition function, the cooling system can be operated at a lower sound level even before speech is detected. Such a mode can also be applied when any microphone of the head-mounted device is attempting to capture audio.

Additionally or alternatively, the cooling system (e.g., fan) can be operated based on directional noise detections and/or a known orientation of the head-mounted device. For example, multiple microphones can be provided for direction noise detections. Ambient noise or another noise can be determined to have a source in a given direction relative to the head-mounted device. The cooling system may produce noise that has a known or determinable direction of propagation. As such, the sound level of the fan noise can be controlled based on whether the direction of propagation for the fan noise is in the direction of the source of the ambient noise. For example, if the head-mounted device is oriented such that the fan noise is directed toward the source of ambient noise, then the sound level of the fan noise can be increased (e.g., such detections can contribute to a determination of a maximum sound level to be applied).

Additionally or alternatively, targets and/or thresholds described herein can be determined based on predefined and/or user-defined inputs. For example, determinations can be made based on settings that can optionally be altered by a user. By further example, the user can provide inputs to initiate, alter, or discontinue functions discussed herein regardless of automated settings.

Accordingly, embodiments of the present disclosure provide a head-mounted device that effectively manages heat while also managing noise output levels in a manner that preserves the user's desired experience with the head-mounted device. The head-mounted device can manage sound levels of a cooling system based on detected a sound level of ambient noise in a vicinity of the head-mounted device. For example, the head-mounted device can operate a fan at a speed that produces noise at a sound level that is low enough to be masked by the ambient noise perceived by the user. By further example, the sound level of a cooling system can be based on a sound level of a speaker of the head-mounted device providing audio to the user. By further example, other operational parameters of a cooling system can be controlled to manage noise at a sound level that is sufficiently low. These measure provide effective cooling to the head-mounted device while maintaining the user's desired experience with the head-mounted device.

As described above, one aspect of the present technology may include the gathering and use of data available from various sources. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. A head-mounted device comprising:
a microphone for detecting an ambient noise;
a fan for cooling the head-mounted device; and
a controller configured to:
determine a sound level of the ambient noise from sources other than the fan, wherein determining the sound level of the ambient noise is based on the detecting of the microphone and a known speed of the fan; and
control a speed of the fan based on the sound level of the ambient noise.

2. The head-mounted device of claim 1, further comprising: a frame for supporting a display element and configured to rest on a nose of a user when the head-mounted device is worn by the user; and
a securement element extending from opposing sides of the frame and configured to secure the frame to a head of the user when the head-mounted device is worn by the user.

3. The head-mounted device of claim 2, further comprising a dock for receiving a portable electronic device comprising the display element, the portable electronic device being removably inserted into the frame of the head-mounted device, wherein the fan is configured to cool the portable electronic device.

4. The head-mounted device of claim 2, wherein the microphone is positioned on a first side of the frame and the fan is positioned on a second side of the frame, opposite the first side.

5. The head-mounted device of claim 2, wherein the fan is positioned on the frame and the microphone is positioned on the securement element.

6. The head-mounted device of claim 1, further comprising a flow path between the fan and the controller, wherein the fan is configured to direct air through the flow path to the controller to cool the controller.

7. The head-mounted device of claim 1, wherein the controller is configured to control the speed of the fan so that a sound level of the fan is lower than a sound level of the ambient noise.

8. A head-mounted device comprising:
a cooling system for cooling a component of the head-mounted device, wherein the cooling system comprises:
a fan configured to direct air against the component; and
a flow path between the fan and the component; and
a controller configured to control a shape of the fan to maintain a sound level of the cooling system below a target level that is based on a temperature of the component of the head-mounted device and a sound level of an ambient noise in a vicinity of the head-mounted device.

9. The head-mounted device of claim 8, further comprising a microphone for detecting the sound level of the ambient noise.

10. The head-mounted device of claim 8, wherein the controller is further configured to control a speed of the fan.

11. The head-mounted device of claim 8, wherein the flow path is defined at least in part by a heat sink thermally connected to the component.

12. The head-mounted device of claim 8, wherein the controller is further configured to reduce a heat-generating activity of the component.

13. A head-mounted device comprising:
- a cooling system for cooling a component of the head-mounted device, wherein the cooling system comprises:
  - a fan configured to direct air against the component; and
  - a flow path between the fan and the component; and
- a controller configured to control a shape of the flow path to maintain a sound level of the cooling system below a target level that is based on a temperature of the component of the head-mounted device and a sound level of an ambient noise in a vicinity of the head-mounted device.

14. The head-mounted device of claim 13, further comprising a microphone for detecting the sound level of the ambient noise.

15. The head-mounted device of claim 13, wherein the controller is further configured to control a speed of the fan.

16. The head-mounted device of claim 13, wherein the flow path is defined at least in part by a heat sink thermally connected to the component.

17. The head-mounted device of claim 13, wherein the controller is further configured to reduce a heat-generating activity of the component.

* * * * *